United States Patent
Zhao et al.

(10) Patent No.: US 11,588,128 B2
(45) Date of Patent: Feb. 21, 2023

(54) ELECTRODE EXHAUST STRUCTURE, ELECTRODE, DISPLAY PANEL AND MANUFACTURING METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Pan Zhao, Beijing (CN); Zhiliang Jiang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/608,493

(22) PCT Filed: Feb. 11, 2019

(86) PCT No.: PCT/CN2019/074792
§ 371 (c)(1),
(2) Date: Oct. 25, 2019

(87) PCT Pub. No.: WO2019/184607
PCT Pub. Date: Oct. 3, 2019

(65) Prior Publication Data
US 2020/0136081 A1    Apr. 30, 2020

(30) Foreign Application Priority Data
Mar. 30, 2018    (CN) .......................... 201810276577.3

(51) Int. Cl.
*H01L 51/52*    (2006.01)
*H01L 51/00*    (2006.01)
*H01L 51/56*    (2006.01)

(52) U.S. Cl.
CPC ...... *H01L 51/5209* (2013.01); *H01L 51/0021* (2013.01); *H01L 51/56* (2013.01)

(58) Field of Classification Search
CPC ... H01L 51/5203–5234; H01L 51/5209; H01L 51/5225; G02F 1/133707
See application file for complete search history.

(56) References Cited

U.S. PATENT DOCUMENTS

| | | | |
|---|---|---|---|
| 2015/0255743 A1* | 9/2015 | Mori | H01L 27/3276 257/40 |
| 2016/0315135 A1* | 10/2016 | Choi | H01L 27/3262 |

(Continued)

FOREIGN PATENT DOCUMENTS

| | | |
|---|---|---|
| CN | 1700953 A | 11/2005 |
| CN | 107658328 A | 2/2018 |

(Continued)

OTHER PUBLICATIONS

Machine translation of WO2014104042, translated Sep. 8, 2021 (Year: 2021).*

*Primary Examiner* — Lauren R Bell
(74) *Attorney, Agent, or Firm* — ArentFox Schiff LLP; Michael Fainberg

(57) ABSTRACT

The disclosure relates to an electrode exhaust structure, an electrode, a display panel and a fabrication method thereof, a display device. The electrode exhaust structure includes first exhaust holes arrayed in a matrix and arranged on an electrode, and second exhaust holes arrayed in a matrix and arranged on the electrode. A column of the second exhaust holes are arranged between adjacent columns of the first exhaust holes, and a row of the second exhaust holes are arranged between adjacent rows of the first exhaust holes; the length of the second exhaust hole in the row direction is greater than or equal to the distance between the adjacent columns of the first exhaust holes; and the length of the (Continued)

second exhaust hole in the column direction is greater than or equal to the distance between the adjacent rows of the first exhaust holes.

10 Claims, 5 Drawing Sheets

(56) References Cited

U.S. PATENT DOCUMENTS

2018/0003400 A1    2/2018  Lee et al.
2018/0081246 A1*  3/2018  Mimura ............ G02F 1/134363
2019/0237490 A1*  8/2019  Hu ...................... H01L 27/1244

FOREIGN PATENT DOCUMENTS

| CN | 108281571 A | 7/2018 | |
| CN | 207947316 U | 10/2018 | |
| WO | WO-2014104042 A1 * | 7/2014 | ............. H01L 27/32 |

\* cited by examiner

ELECTRODE EXHAUST STRUCTURE, ELECTRODE, DISPLAY PANEL AND MANUFACTURING METHOD THEREFOR, AND DISPLAY APPARATUS

The disclosure is a US National Stage of International Application No. PCT/CN2019/074792, filed Feb. 11, 2019, which claims priority to Chinese Patent Publication No. 201810276577.3, filed with the Chinese Patent Office on Mar. 30, 2018 and entitled "electrode exhaust structure, electrode, display panel and display device", the disclosure of which is hereby incorporated by reference in its entirety.

FIELD

The disclosure relates to the field of recognition technologies, and particularly to an electrode exhaust structure, an electrode, a display panel and a fabrication method thereof, a display device.

BACKGROUND

In a process of fabricating an Organic Light-Emitting Diode (OLED), an anode is generally formed by using an evaporation process, and the anode is formed on an organic material layer. The high temperature of the evaporation process may cause the vaporization of a part of the organic material layer to produce steam. In order to avoid the steam from corroding the anode formed, there is a need to form exhaust holes on the anode to release the steam.

As shown in FIG. 1, exhaust holes 20 formed at present on an anode 10 are arrayed in a matrix, and there are obvious anode continuous regions in both a row direction (x direction) and a column direction (y direction). That is, the width of the anode 10 remains unchanged in a longer range, but obvious anode continuous regions may influence exhaust effect.

SUMMARY

The disclosure provides an electrode exhaust structure, an electrode, a display panel and a fabrication method thereof, a display device, so as to solve deficiencies in the related art.

According to a first aspect of embodiments of the disclosure, an electrode exhaust structure is provided. The electrode exhaust structure includes first exhaust holes arrayed in a matrix and arranged on an electrode; and second exhaust holes arrayed in a matrix and arranged on the electrode. A column of the second exhaust holes are arranged between adjacent columns of the first exhaust holes, and a row of the second exhaust holes are arranged between adjacent rows of the first exhaust holes. In a row direction, a length of the second exhaust hole is greater than or equal to a minimum distance between the adjacent columns of the first exhaust holes; and in a column direction, the length of the second exhaust hole is greater than or equal to a minimum distance between the adjacent rows of the first exhaust holes.

Optionally, the first exhaust hole and the second exhaust hole are of centrosymmetric shapes.

Optionally, the first exhaust hole and the second exhaust hole are roughly of rectangles.

Optionally, the first exhaust hole and the second exhaust hole are roughly of squares. First and third edges of the first exhaust hole are parallel to the row direction, and second and fourth edges of the first exhaust hole are parallel to the column direction; and four edges of the second exhaust hole have an included angle of about 45 degrees with respect to the row direction respectively.

Optionally, the first exhaust hole is roughly of a rectangle and the second exhaust hole is roughly of a circle; or both of the first exhaust hole and the second exhaust hole are roughly of circles.

Optionally, an area of each of the first exhaust holes is equal to an area of each of the second exhaust holes.

Optionally, a center of the second exhaust hole is configured at a position from which distances to centers of four second exhaust holes adjacent thereto are approximately equal.

According to a second aspect of embodiments of the disclosure, an electrode is provided, which includes the electrode exhaust structure described in any one of the above-mentioned embodiments.

According to a third aspect of embodiments of the disclosure, a display panel is provided, which includes the electrode described in above-mentioned embodiment.

Optionally, the display panel further includes a substrate and an organic material layer arranged on the substrate; the electrode is arranged on the organic material layer, and the electrode exhaust structure on the electrode overlaps with the organic material layer.

Optionally, the display panel includes an effective display area and a non-display area arranged around the effective display area; the electrode includes a function part located in the effective display area, and an auxiliary part located in the non-display area; the electrode exhaust structure is located on the auxiliary part.

According to a fourth aspect of an embodiment of the disclosure, a fabrication method of a display panel is provided, which includes: forming an organic material layer on a substrate; forming a first electrode on the organic material layer, wherein the electrode exhaust structure described in any one of the above-mentioned embodiments is formed in the first electrode in the process of forming the first electrode.

Optionally, the forming the first electrode on the organic material layer includes: forming the first electrode on the organic material layer by an evaporation process.

Optionally, the forming the electrode exhaust structure described in any one of the above-mentioned embodiments in the first electrode in the process of forming the first electrode includes: forming the first electrode and the electrode exhaust structure in the first electrode simultaneously by using a single patterning process.

According to a fifth aspect of an embodiment of the disclosure, a display device is provided, which includes the display panel described in any one of the above-mentioned embodiments.

It can be seen from the above-mentioned embodiments that the second exhaust holes are arranged between the rows and columns of first exhaust holes, and since the length of the second exhaust hole in the row direction is greater than or equal to the distance between the adjacent columns of first exhaust holes, the second exhaust holes separate the electrodes between the adjacent columns of first exhaust holes so that there is no obvious continuous region of the electrodes between the adjacent columns of first exhaust holes and there is no obvious continuous region of the electrodes between the adjacent columns of second exhaust holes. Since the length of the second exhaust hole in the column direction is greater than or equal to the distance between the adjacent rows of the first exhaust holes, the second exhaust holes can separate the electrodes between the adjacent rows of first exhaust holes so that there is no obvious continuous region of the electrodes between the adjacent rows of first exhaust holes and there is no obvious continuous region of the electrodes between the adjacent rows of second exhaust holes.

Therefore it can be ensured that there is an exhaust region of the exhaust holes arranged in the electrode and there is no obvious continuous region of the electrode, to thereby reduce the influence on the exhaust effect of the exhaust region and ensure that the exhaust region has good exhaust effect.

It should be understood that the above general description and the following detailed description are only exemplary and illustrative, and cannot limit the disclosure.

BRIEF DESCRIPTION OF THE DRAWINGS

The accompanying drawings here are incorporated into and constitute a part of the specification, illustrate the embodiments conforming to the present disclosure, and together with the specification, serve to explain the principles of the disclosure.

DETAILED DESCRIPTION

Figure 1:
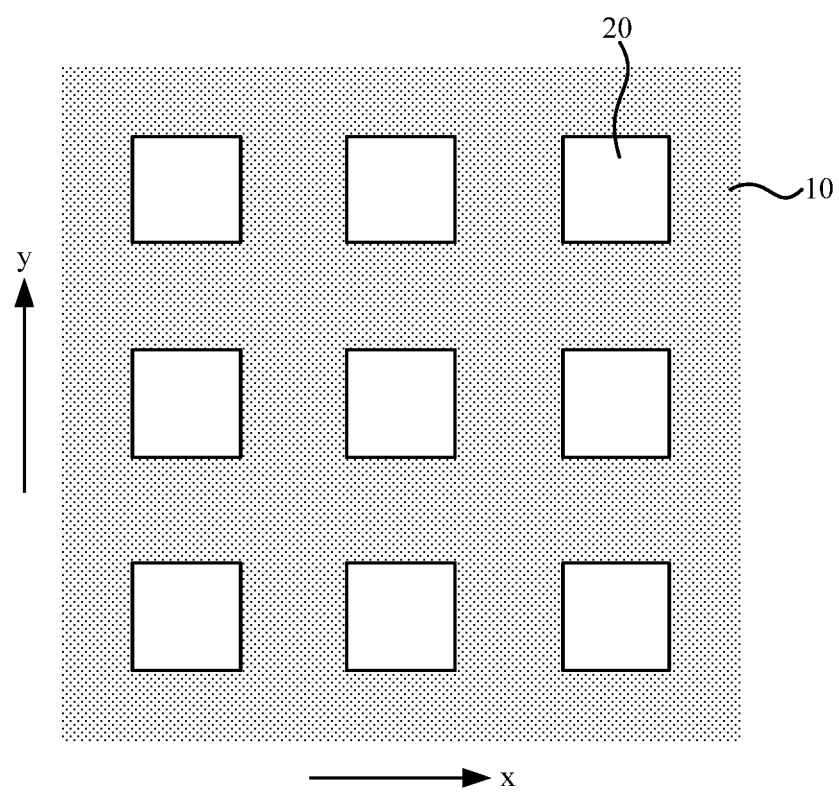
FIG. 1 is a structural schematic diagram of an electrode exhaust structure in the related art.

The exemplary embodiments will be illustrated here in details. The examples thereof are represented in the drawings. When the following description relates to the drawings, the same numbers represent the same or similar elements in the different drawings, unless otherwise indicated. The implementation modes described in the following exemplary embodiments do not represent all the implementation modes consistent with the disclosure. On the contrary, they are only the examples of the devices and methods which are detailed in the attached claims and consistent with some aspects of the disclosure.

Figure 2:
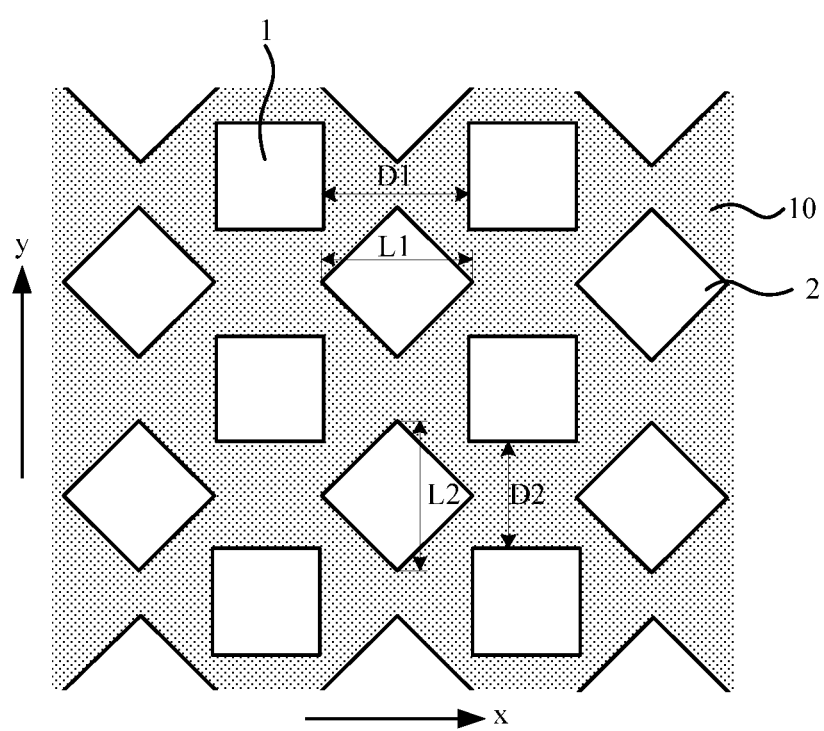
FIG. 2 is a structural schematic diagram of an electrode exhaust structure shown according to an embodiment of the disclosure.
Figure 3:
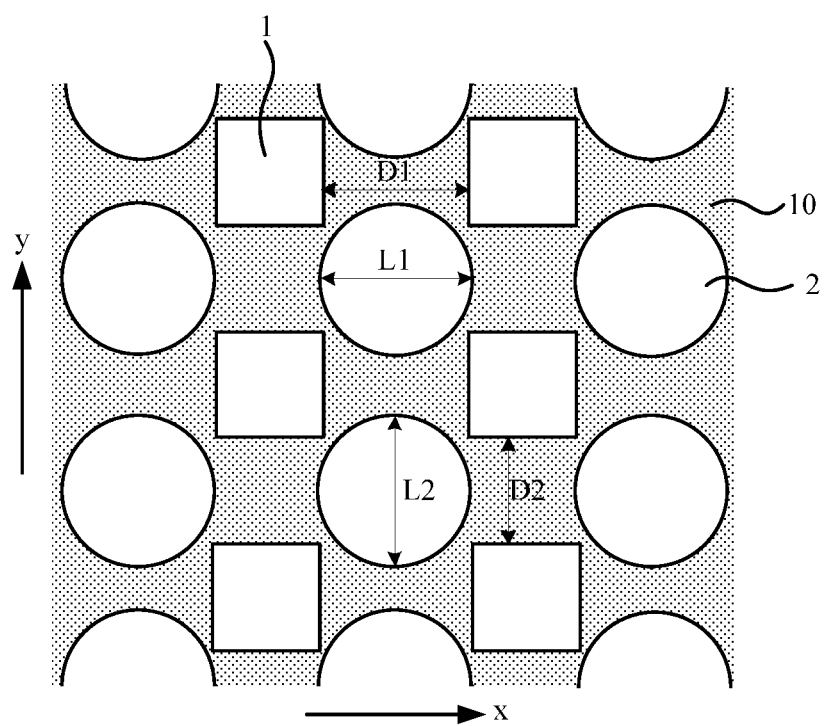
FIG. 3 is a structural schematic diagram of another electrode exhaust structure shown according to an embodiment of the disclosure.
Figure 4:
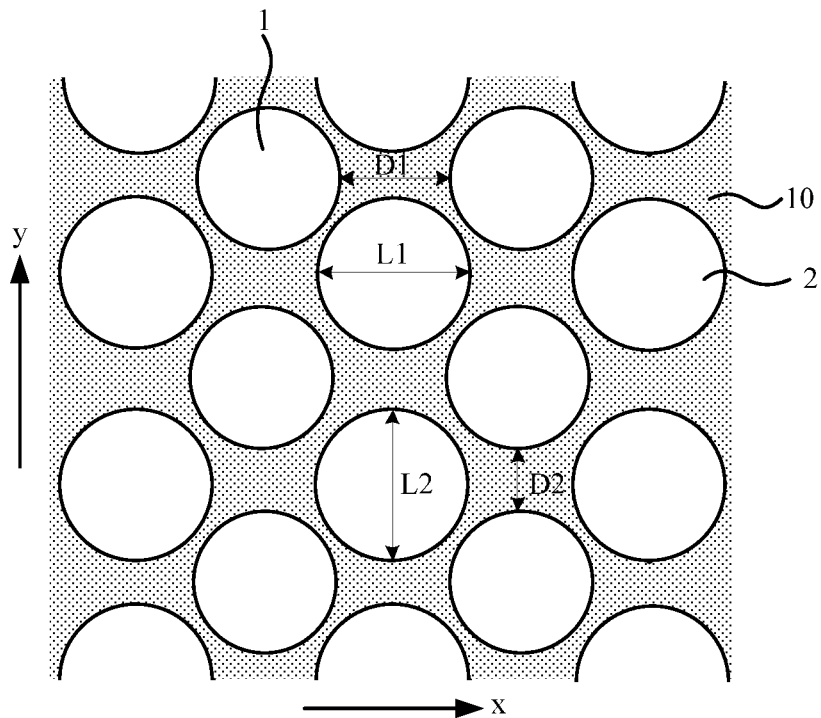
FIG. 4 is a structural schematic diagram of yet another electrode exhaust structure shown according to an embodiment of the disclosure.

FIG. 2 to FIG. 4 are the structural schematic diagrams of the electrode exhaust structure shown according to the embodiments of the disclosure. The electrode exhaust structure as shown in the embodiments is arranged in an electrode, e.g., an anode in an organic light-emitting diode. The electrode exhaust structure as shown in the embodiments is also arranged in another electrode, e.g., a cathode, a common electrode, or a pixel electrode in a liquid crystal display panel, etc., as needed. The material of said electrode is the transparent conductive material, e.g., indium tin oxide.

As shown in FIG. 2 to FIG. 4, the electrode exhaust structure includes a first exhaust holes 1 arrayed in a matrix and arranged on an electrode 10, and a second exhaust holes 2 arrayed in a matrix and arranged on the electrode 10. A column of the second exhaust holes 2 are arranged between adjacent columns of the first exhaust holes 1, and a row of the second exhaust holes 2 are arranged between adjacent rows of the first exhaust holes 1. The length L1 of the second exhaust hole 2 in a row direction (x direction) is greater than or equal to the minimum distance D1 between adjacent columns of the first exhaust holes 1. The length L2 of the second exhaust hole 2 in a column direction (y direction) is greater than or equal to the minimum distance D2 between adjacent rows of the first exhaust holes 1.

In an embodiment, the second exhaust holes 2 are arranged between the rows and columns of the first exhaust holes 1, and since the length L1 of the second exhaust hole 2 in the row direction is greater than or equal to the distance D1 between the adjacent columns of first exhaust holes 1, the second exhaust holes 2 separate electrodes between the adjacent columns of the first exhaust holes 1, so that there is no obvious continuous region of the electrodes between the adjacent columns of the first exhaust holes 1 and there is no obvious continuous region of the electrodes between the adjacent columns of the second exhaust holes 2; and since the length L2 of the second exhaust hole 2 in the column direction is greater than or equal to the distance D2 between the adjacent rows of the first exhaust holes 1, the second exhaust holes 2 separates electrodes between the adjacent rows of the first exhaust holes 1, so that there is no obvious continuous region of the electrodes between the adjacent rows of the first exhaust holes 1 and there is no obvious continuous region of the electrodes between the adjacent rows of second exhaust holes 2.

Therefore it may be ensured that there is an exhaust region of the exhaust holes arranged in the electrode and there is no obvious continuous region of the electrode, to thereby reduce the influence on the exhaust effect of the exhaust region and ensure that the exhaust region has good exhaust effect.

It is necessary to note that the shapes and position relationship of the first exhaust holes and the second exhaust holes are not limited to the cases as shown in FIG. 2 to FIG. 4, and the shapes and position relationship of the first exhaust holes and the second exhaust holes may be adjusted as needed. Specifically, in order to facilitate the fabrication, the first exhaust hole and the second exhaust hole are of centrosymmetric shapes. In order to ensure uniformity of exhaust effect, a center of the second exhaust hole is arranged at a position from which the distances to centers of four second exhaust holes around the second exhaust hole are equal.

Optionally, the first exhaust hole and the second exhaust hole are roughly of rectangles. 'Being roughly of a rectangle' refers to the shape which looks like a rectangle but is actually different from the rectangle in addition to the rectangle. For example, the shape may have rounded corner(s), or there is heteromorphism caused by avoidance of some structures on a perimeter, or the included angle thereof has a deviation of positive or negative 5 degrees with respect to a right angle. Specifically, the principle of the wording 'roughly' mentioned thereafter is the same as the above.

In an embodiment, since the exhaust holes are generally fabricated by a patterning process, and a mask pattern corresponding to rectangular exhaust holes are relatively easy to be fabricated, the process is simplified.

Optionally, as shown in FIG. 2, the first exhaust hole 1 and the second exhaust hole 2 are roughly of squares.

Here first and third edges of the first exhaust hole 1 are parallel to the row direction (x direction), and second and fourth edges of the first exhaust hole 1 are parallel to the column direction (y direction); and four edges of the second exhaust hole 2 have an included angle of about 45 degrees with respect to the row direction respectively and may have a deviation of positive or negative 5 degrees.

In an embodiment, both of the first exhaust hole 1 and the second exhaust hole 2 are set as the squares, and the four edges of the second exhaust hole 2 are set to have the included angle of 45 degrees with respect to the row direction (and also have the included angle of 45 degrees with respect to the column direction). It can be ensured that the lengths of the second exhaust hole 2 in the row and column directions are same, and the distances between the rows and columns of first exhaust holes 1 are fixed, so that the second exhaust holes 2 and the first exhaust holes 1 can be arranged conveniently, to ensure that the relationship therebetween meets: the length of the second exhaust hole 2 in the row direction is greater than or equal to the distance between the adjacent columns of first exhaust holes 1; and the length of the second exhaust hole 2 in the column direction is greater than or equal to the distance between the adjacent rows of first exhaust holes 1.

Optionally, as shown in FIG. 3, the first exhaust hole is roughly of a rectangle and the second exhaust hole is roughly of a circle.

In an embodiment, the second exhaust hole 2 can be adjusted to a circle as needed. Since diameters of the circle are equal in all the directions, the second exhaust holes 2 and the first exhaust holes 1 are arranged conveniently, to ensure that the relationship therebetween meets: the diameter of the second exhaust hole 2 is greater than or equal to the distance between the adjacent columns of first exhaust holes 1 and greater than or equal to the distance between the adjacent rows of first exhaust holes 1. Specifically, there is only a need to adjust the positions of the second exhaust holes 2 appropriately without adjusting the angles of the second exhaust holes 2, to ensure the separation of the electrodes by the second exhaust holes 2 and ensure that there is no obvious continuous region of the electrodes, facilitating the arrangement of the second exhaust holes 2.

Optionally, as shown in FIG. 4, both of the first exhaust hole 1 and the second exhaust hole 2 are of the circle; and similarly to the embodiment of FIG. 3, since the diameters of the circle are equal in all the directions, the second exhaust holes 2 and the first exhaust holes 1 are arranged conveniently, to ensure that the relationship therebetween meets: the diameter of the second exhaust hole 2 is greater than or equal to the distance between the adjacent columns of first exhaust holes 1 and greater than or equal to the distance between the adjacent rows of first exhaust holes 1.

Optionally, the area of each of the first exhaust holes is equal to the area of each of the second exhaust holes.

In an embodiment, since there is a need to make the wiring according to the electrodes around the exhaust holes and the area of the wiring is generally predetermined, there is also a need to predetermine the area of the exhaust holes for etching, to ensure that the area of the remaining electrodes is sufficient for the wiring. The area of the exhaust holes can be calculated conveniently by setting the area of the first exhaust holes to be equal to the area of the second exhaust holes, to thereby facilitate the etching of the exhaust holes.

An embodiment of the disclosure further provides an electrode, which includes the electrode exhaust structure described in any one of the above-mentioned embodiments.

Here the electrode can be the anode or cathode in the Organic Light-Emitting Diode (OLED), or can be the pixel electrode, common electrode in the liquid crystal display panel, or even can be the touch electrode in the touch sensor.

An embodiment of the disclosure further provides a display panel, which includes the electrode described in above-mentioned embodiment. Here the display panel can be an Organic Light-Emitting Diode display panel, so the electrode can be the anode or cathode; the display panel can also be a liquid crystal display panel, so the electrode can be the pixel electrode or common electrode.

In an embodiment, the display panel further includes a substrate and an organic material layer arranged on the substrate; the electrode is arranged on the organic material layer, and an electrode exhaust structure on the electrode overlaps with the organic material layer.

Optionally, the display panel includes a Thin Film Transistor array (TFT array) arranged on the substrate, and the organic material layer is a planar layer located on the TFT array.

In an embodiment, for the organic light-emitting diode display panel, the electrode is the anode. Since the anode is generally formed by way of evaporation after the organic material layer is formed, but a part of the organic material layer may be evaporated by the high temperature in the evaporation process, it can be ensured that the evaporated gas is discharged from the display panel via the electrode exhaust structure on the anode by arranging the electrode exhaust structure in the above-mentioned embodiments on the anode, to avoid the influence on the structure in the display panel.

Optionally, the display panel includes an effective display area and a non-display area arranged around the effective display area; the electrode includes a function part located in the effective display area, and an auxiliary part located in the non-display area; and the electrode exhaust structure is located on the auxiliary part. Specifically, the function part is the part used to generate the driving voltage in the electrode; for example, for the OLED display panel, the function part can be the electrode block part corresponding to each sub-pixel in the anode; and for the liquid crystal display panel, the function part can be the electrode block part corresponding to each sub-pixel in the pixel electrode.

In an embodiment, the effective display area (AA area) needs to display the images and the voltage generated by the electrode is nonuniform in the area with the exhaust holes arranged, which may affect the image display effect, so the influence on the images in the effective display area can be avoided by arranging the electrode exhaust structure on the auxiliary part of the non-display area.

Figure 5:
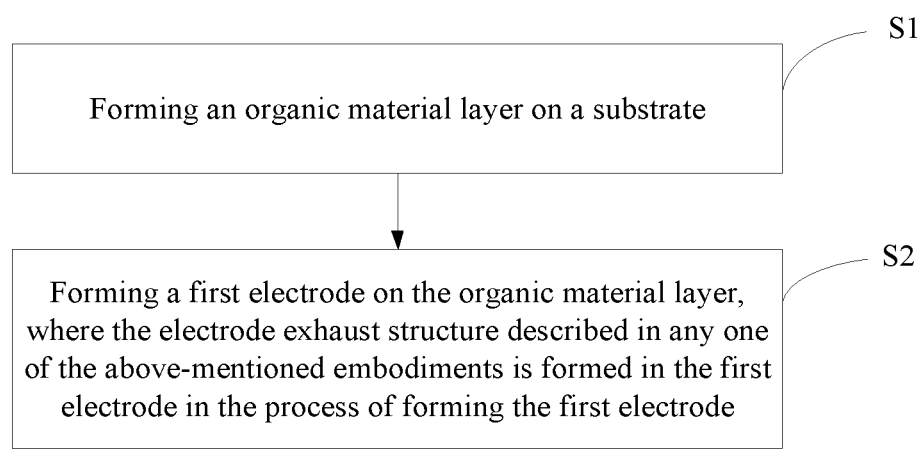
FIG. 5 is a schematic flow chart of a fabrication method of a display panel shown according to an embodiment of the disclosure.

FIG. 5 is a schematic flow chart of a fabrication method of a display panel shown according to an embodiment of the disclosure. As shown in FIG. 5, the embodiment of the disclosure provides a fabrication method of the display panel, which includes the following operations.

Operation S1: forming an organic material layer on a substrate.

Operation S2: forming a first electrode on the organic material layer, where the electrode exhaust structure described in any one of the above-mentioned embodiments is formed in the first electrode in the process of forming the first electrode.

Figure 6:
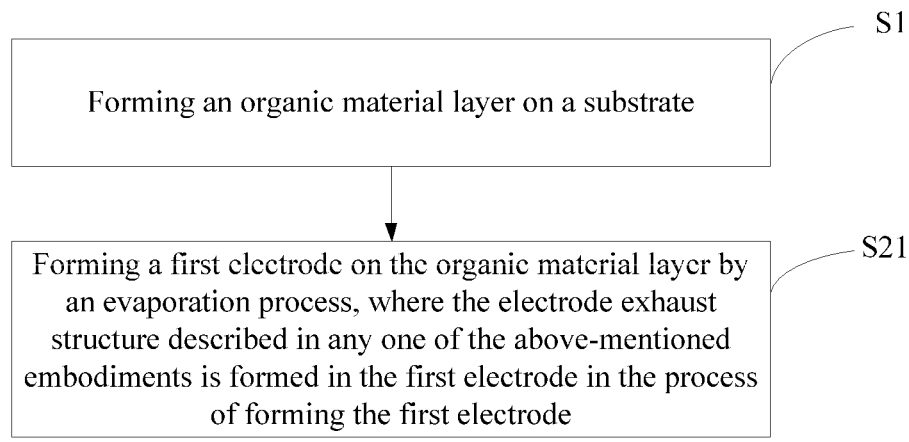
FIG. 6 is a schematic flow chart of another fabrication method of a display panel shown according to an embodiment of the disclosure.

FIG. 6 is a schematic flow chart of another fabrication method of a display panel shown according to an embodiment of the disclosure. As shown in FIG. 6, and on the basis of the embodiment shown in FIG. 5, the forming the first electrode on the organic material layer includes: operation S21: forming a first electrode on the organic material layer by an evaporation process.

Figure 7:
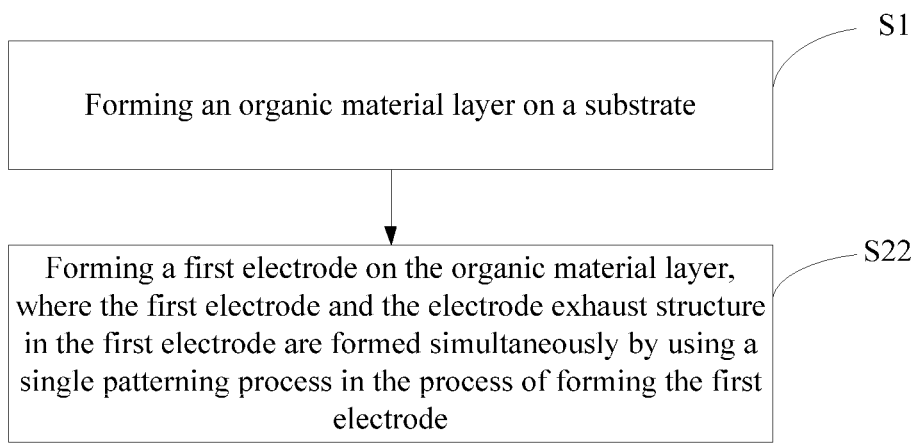
FIG. 7 is a schematic flow chart of yet another fabrication method of a display panel shown according to an embodiment of the disclosure.

FIG. 7 is a schematic flow chart of yet another fabrication method of a display panel shown according to an embodiment of the disclosure. As shown in FIG. 7, and on the basis of the embodiment shown in FIG. 5, forming the electrode exhaust structure described in any one of the above-mentioned embodiments in the first electrode in the process of forming the first electrode includes: operation S22: forming the first electrode and the electrode exhaust structure in the first electrode simultaneously by using a single patterning process.

Of course, it is also possible to form the electrode exhaust structure in the first electrode by using another patterning process after forming the first electrode by using the first patterning process.

Specifically, the above-mentioned patterning process includes one or more operations of the photoresist coating, mask exposure, etching, developing, and ashing.

An embodiment of the disclosure further provides a display device including the display panel described in any one of the above-mentioned embodiments. It is necessary to note that the display device in this embodiment may be an e-paper, a mobile phone, a tablet, a television, a laptop, a digital photo frame, a navigator, or any other product or component with display functions.

In the disclosure, the terms "first" and "second" are only for purpose of description, and cannot be construed to indicate or imply the relative importance. The term "a plurality of" refers to two or more, unless otherwise defined explicitly.

After considering the specification and practicing the disclosure herein, those skilled in the art will readily come up with other embodiments. The disclosure is intended to encompass any variations, usages or applicability changes of the disclosure, and these variations, usages or applicability changes follow the general principle of the disclosure and include the common knowledge or customary technological means in the technical field which is not disclosed in the disclosure. The specification and embodiments are illustrative only, and the true scope and spirit of the disclosure is pointed out by the following claims.

It should be understood that the disclosure is not limited to the precise structures which have been described above and shown in the figures, and can be modified and changed without departing from the scope of the disclosure. The scope of the disclosure is only limited by the attached claims.

What is claimed is:

1. An electrode exhaust structure, comprising:
   a plurality of first exhaust holes arrayed in a matrix and arranged on an electrode; and
   a plurality of second exhaust holes arrayed in a matrix and arranged on the electrode;
   wherein a column of the second exhaust holes is arranged between adjacent two columns of the first exhaust holes; and
   in a column direction, a length of each of the second exhaust holes is greater than a distance between adjacent two rows of the first exhaust holes, wherein the column direction is a vertical direction extending along a width edge of an exhaust region of the electrode;
   wherein each of the first exhaust holes and the second exhaust holes are squares;
   wherein first and third edges of each of the first exhaust holes are parallel to a row direction, and second and fourth edges of each of the first exhaust holes are parallel to the column direction; and
   four edges of each of the second exhaust holes each have an included angle of 45 degrees with respect to the row direction, wherein the row direction is a horizontal direction extending along a length edge of the exhaust region of the electrode.

2. The electrode exhaust structure according to claim 1, wherein an area of each of the first exhaust holes is equal to an area of each of the second exhaust holes.

3. The electrode exhaust structure according to claim 1, wherein distances between a center of one of the second exhaust holes and centers of four of the first exhaust holes located around and adjacent to the one second exhaust hole are approximately equal.

4. The electrode exhaust structure according to claim 1, wherein lowest points of a $n^{th}$ row of the second exhaust holes is lower than highest points of a $n^{th}$ row of the first exhaust holes, and highest points of a $(n+1)^{th}$ row of the second exhaust holes is higher than lowest points of the $n^{th}$ row of the first exhaust holes, wherein n is a positive integer.

5. The electrode exhaust structure according to claim 1, wherein a row of the second exhaust holes is arranged between the adjacent two rows of the first exhaust holes;
   in the row direction, a length of each of the second exhaust holes is greater than or equal to a distance between the adjacent two columns of the first exhaust holes.

6. An electrode, comprising an electrode exhaust structure, wherein the electrode exhaust structure comprises:
   a plurality of first exhaust holes arrayed in a matrix and arranged on an electrode; and a plurality of second exhaust holes arrayed in a matrix and arranged on the electrode;
   wherein a column of the second exhaust holes is arranged between adjacent to columns of the first exhaust holes; and
   in a column direction, a length of each of the second exhaust holes is greater than a distance between adjacent two rows of the first exhaust holes, wherein the column direction is a vertical direction extending along a width edge of an exhaust region of the electrode;
   wherein each of the first exhaust holes and the second exhaust holes are squares;
   wherein first and third edges of each of the first exhaust holes are parallel to a row direction, and second and fourth edges of each of the first exhaust holes are parallel to the column direction; and
   four edges of each of the second exhaust holes each have an included angle of 45 degrees with respect to the row direction, wherein the row direction is a horizontal direction extending along a length edge of the exhaust region of the electrode.

7. A display panel, comprising an electrode comprising an electrode exhaust structure, wherein the electrode exhaust structure comprises:
   a plurality of first exhaust holes arrayed in a matrix and arranged on an electrode; and
   a plurality of second exhaust holes arrayed in a matrix and arranged on the electrode;
   wherein a column of the second exhaust holes is arranged between adjacent two columns of the first exhaust holes; and
   in a column direction, a length of each of the second exhaust holes is greater than a distance between adjacent two rows of the first exhaust holes, wherein the column direction is a vertical direction extending along a width edge of an exhaust region of the electrode;

wherein each of the first exhaust holes and the second exhaust holes are squares;

wherein each of first and third edges of the first exhaust holes are parallel to a row direction, and second and fourth edges of each of the first exhaust holes are parallel to the column direction; and four edges of each of the second exhaust holes each have an included angle of 45 degrees with respect to the row direction, wherein the row direction is a horizontal direction extending along a length edge of the exhaust region of the electrode.

8. The display panel according to claim 7, wherein the display panel further comprises:

a substrate; and an organic material layer arranged on the substrate;

wherein the electrode is arranged on the organic material layer, and the electrode exhaust structure on the electrode overlaps with the organic material layer.

9. The display panel according to claim 7, wherein the display panel comprises:

an effective display area; and a non-display area arranged around the effective display area;

wherein the electrode comprises a function part located in the effective display area, and an auxiliary part located in the non-display area; and the electrode exhaust structure is located on the auxiliary part.

10. A display device, comprising the display panel of claim 7.

* * * * *